United States Patent
Muralimanohar et al.

(10) Patent No.: US 11,157,237 B2
(45) Date of Patent: Oct. 26, 2021

(54) MEMRISTIVE DOT PRODUCT CIRCUIT BASED FLOATING POINT COMPUTATIONS

(71) Applicant: HEWLETT PACKARD ENTERPRISE DEVELOPMENT LP, Houston, TX (US)

(72) Inventors: Naveen Muralimanohar, Palo Alto, CA (US); Benjamin Feinberg, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 208 days.

(21) Appl. No.: 16/189,291

(22) Filed: Nov. 13, 2018

(65) Prior Publication Data

US 2020/0150923 A1    May 14, 2020

(51) Int. Cl.
   *G06F 7/487*    (2006.01)
   *G06F 5/01*     (2006.01)
   *G11C 13/00*    (2006.01)
   *H03M 7/24*     (2006.01)
   *G06F 17/16*    (2006.01)

(52) U.S. Cl.
   CPC .......... *G06F 7/4876* (2013.01); *G06F 5/012* (2013.01); *G06F 17/16* (2013.01); *G11C 13/0002* (2013.01); *H03M 7/24* (2013.01)

(58) Field of Classification Search
   CPC ........................................... G06F 17/16
   See application file for complete search history.

(56) References Cited

U.S. PATENT DOCUMENTS

| | | |
|---|---|---|
| 7,337,205 B2 | 2/2008 | Sazegari |
| 7,558,943 B2 | 7/2009 | Ebisuzaki et al. |
| 9,465,578 B2 | 10/2016 | Tannenbaum et al. |

(Continued)

FOREIGN PATENT DOCUMENTS

WO    WO-2017127086 A1 *    7/2017    ........... G06F 7/5443

OTHER PUBLICATIONS

Banescu, S. et al.; "Multipliers for Floating-point Double Precision and Beyond on FPGAs"; Jun. 1, 2010; 6 pages. http://citeseerx.ist.psu.edu/viewdoc/download?doi=10.1.1.185.3722&rep=rep1&type=pdf.

(Continued)

*Primary Examiner* — Michael D. Yaary
(74) *Attorney, Agent, or Firm* — Sheppard Mullin Richter & Hampton LLP

(57) ABSTRACT

In some examples, memristive dot product circuit based floating point computations may include ascertaining a matrix and a vector including floating point values, and partitioning the matrix into a plurality of sub-matrices according to a size of a plurality of memristive dot product circuits. For each sub-matrix of the plurality of sub-matrices, the floating point values may be converted to fixed point values. Based on the conversion and selected ones of the plurality of memristive dot product circuits, a dot product operation may be performed with respect to a sub-matrix and the vector. Each ones of the plurality of memristive dot product circuits may include rows including word line voltages corresponding to the floating point values of the vector, conductances corresponding to the floating point values of an associated sub-matrix, and columns that include bitline currents corresponding to dot products of the voltages and conductances.

20 Claims, 10 Drawing Sheets

(56) References Cited

U.S. PATENT DOCUMENTS

| | | |
|---|---|---|
| 9,524,270 B2 | 12/2016 | Manohar et al. |
| 2017/0228345 A1* | 8/2017 | Gupta ................... G06F 17/16 |
| 2017/0372202 A1 | 12/2017 | Ginsburg et al. |
| 2020/0019587 A1* | 1/2020 | Pescianschi ............ G06F 17/16 |

OTHER PUBLICATIONS

Dou, Y. et al.; "64-bit Floating-point FPGA Matrix Multiplication"; Feb. 20-22, 2005; 10 pages. http://citeseerx.ist.psu.edu/viewdoc/download?doi=10.1.1.76.2797&rep=rep1&type=pdf.

Matam, K. et al.; "Evaluating Enemy Efficiency of Floating Point Matrix Multiplication on FPGAs"; Aug. 2, 2013; 6 pages. http://halcyon.usc.edu/~pk/prasannawebsite/papers/2013/Kiran_hpec13.pdf.

"SPEC CPU2006 Benchmark Descriptions." Aug. 24, 2006, 17 pages.

Alibart et al., "High precision tuning of state for memristive devices by adaptable variation-tolerant algorithm", Nanotechnology, vol. 23, No. 7, 2012, 20 pages.

Bell et al., "Efficient Sparse Matrix-Vector Multiplication on CUDA", NVIDIA Technical Report Corporation, Dec. 11, 2008, 32 pages.

Bojnordi et al., "Memristive Boltzmann Machine: A Hardware Accelerator for Combinatorial Optimization and Deep Learning", in Proceedings of theInternational Symposium on High Performance Computer Architecture, IEEE 2016, pp. 1-13.

Buluc et al., "Parallel Sparse Matrix-Vector and Matrix-Transpose-Vector Multiplication Using Compressed Sparse Blocks", Proceedings of the twenty-first annual symposium on Parallelism in algorithms and architectures, 2009, 12 pages.

Converter Passion, "ADC performance evolution: Walden figure-of-merit (FOM)", available online at <https://converterpassion.wordpress.com/2012/08/21/adc-performance-evolution-walden-figure-of-merit-fom/>, Aug. 21, 2012, 8 pages.

D. Locklear, "Chipkill Correct Memory Architecture", tech. rep., Dell, 2000, 4 pages.

Datar et al., "Locality-sensitive hashing scheme based on p-stable distributions", Proceedings of the twentieth annual symposium on Computational geometry, 2004, pp. 253-262.

Davis et al., "The university of florida sparse matrix collection", ACM Trans. Math. Softw., vol. 38, Issue 1, 2011, 28 pages.

Dongarra et al., "Hpcg benchmark: a new metric for ranking high performance computing systems", tech. rep., Electrical Engineering and Computer Science Department, Knoxville, Tennessee, 2015, 11 pages.

Dongarra et al., "The linpack benchmark: Past, present, and future. concurrency and computation: Practice and experience", Concurrency and Computation: Practice and Experience, vol. 15, 2003, pp. 803-820.

Elliott et al., "Computational RAM: Implementing Processors in Memory", Design Test of Computers, IEEE, vol. 16, Jan. 1999, pp. 32-41.

Genov et al., "Charge-Mode Parallel Architecture for Matrix-Vector Multiplication", Proceedings of the 43rd IEEE Midwest Symposium on Circuits and Systems, vol. 1, Aug. 8-11, 2000, pp. 506-509.

Genov et al., "Kerneltron: Support Vector "Machine" in Silicon", IEEE Transactions on Neural Networks, vol. 14 (5), Sep. 2003, pp. 1426-1434.

Gokhale et al., "Processing in Memory: The Terasys Massively Parallel PIM Array", Computer, vol. 28, Issue 4, Apr. 1995, pp. 23-31.

Guo et al., "A Resistive TCAM Accelerator for Data-Intensive Computing", Proceedings of the 44th Annual IEEE/ACM International Symposium on Microarchitecture, Dec. 3-7, 2011, 13 pages.

Guo et al., "AC-DIMM: Associative Computing with STT-MRAM", in Proceedings of the 40th Annual International Symposium on Computer Architecture, ISCA'13, 2013, 12 pages.

Hong et al., "An 8.6 enob 900ms/s time-interleaved 2b/cycle sar adc with a 1b/cycle reconfiguration for resolution enhancement", in Solid-State Circuits Conference Digest of Technical Papers (ISSCC), IEEE International, 2013, pp. 470-471.

Hu et al., "Dot-Product Engine for Deep learning", in ICCAD workshop on Hardware and Algorithms for Learning On-a-Chip (HALO), (Austin), Nov. 2015.

Hu et al., "The Dot-Product Engine: Programming Memristor Crossbar Arrays for Efficient Vector-Matrix Multiplication", in ICCAD workshop on Efficient Computing in the Dark Silicon Era, (Austin), Nov. 2015, 1 page.

Im et al., "SPARSITY: Optimization Framework for Sparse Matrix Kernels", Int. J. High Perform. Comput. Appl., vol. 18(1), 2004, pp. 1-39.

Keckler et al., "Gpus and the future of parallel computing", IEEE Micro, vol. 31, Issue 5, 2011, pp. 7-17.

Kull et al., "A 3.1mw 8b 1.2gs/s single-channel asynchronous sar adc with alternate comparators for enhanced speed in 32nm digital soi cmos", in Solid-State Circuits Conference Digest of Technical Papers (ISSCC), 2013 IEEE International, pp. 468-469.

Lim et al., "11.5 a 100MS/s 10.5b 2.46mW comparator-less pipeline ADC using self-biased ring amplifiers", IEEE International Solid-State Circuits Conference Digest of Technical Papers (ISSCC), 2014, pp. 202-203.

Muralimanohar et al., "Optimizing NUCA Organizations and Wiring Alternatives for Large Caches with CACTI 6.0", in Proceedings of MICRO, Dec. 2007, 13 pages.

Oskin et al., "Active Pages: A Computation Model for Intelligent Memory", Proceedings of the 25th Annual International Symposium on Computer Architecture, 1998, 12 pages.

Raoux et al., "Phase-Change Random Access Memory: A Scalable Technology", IBM Journal of Research and Development archive, vol. 52, Issue 4, Jul. 2008, pp. 465-479.

T. J. Dell, "A Whitepaper on the Benefits of Chipkill-Correct ECC for PC Server Main Memory", tech. rep., IBM Microelectronics Division, 1997, 24 pages.

Udipi et al., "LOT-ECC: Localized and Tiered Reliability Mechanisms for Commodity Memory Systems", in Proceedings of ISCA, 2012, 12 pages.

Whaley et al., "Automatically Tuned Linear Algebra Software", in Conference on High Performance Networking and Computing, IEEE Computer Society, 1998, pp. 1-31.

Wikipedia, "Open-Access-based PDK for 45nm Technology Node.", available online at <https://www.eda.ncsu.edu/index.php?title=FreePDK&oldid=4045>, May 29, 2014, 1 page.

Xu et al., "Overcoming the Challenges of Cross-Point Resistive Memory Architectures", in Proceedings of HPCA, 2015, 13 pages.

Xu et al., "Understanding the Trade-Offs in Multi-Level Cell ReRAM Memory Design", in Proceedings of DAC, 2013, 6 pages.

Y. Saad, "Iterative Methods for Sparse Linear Systems", SIAM, 2003, 567 pages.

Zangeneh et al., "Design and Optimization of Nonvolatile Multibit 1t1r Resistive Ram", IEEE Transactions on Very Large Scale Integration (VLSI) Systems, vol. 22, Issue 8, Aug. 2014, pp. 1815-1828.

* cited by examiner

700

ASCERTAIN A MATRIX AND A VECTOR INCLUDING FLOATING POINT VALUES
702

PARTITION THE MATRIX INTO A PLURALITY OF SUB-MATRICES ACCORDING TO A SIZE OF A PLURALITY OF MEMRISTIVE DOT-PRODUCT CIRCUITS THAT ARE DISPOSED IN A PLURALITY OF CLUSTERS
704

FOR EACH SUB-MATRIX OF THE PLURALITY OF SUB-MATRICES, CONVERT THE FLOATING POINT VALUES TO FIXED POINT VALUES
706

PERFORM, BASED ON THE CONVERSION AND SELECTED ONES OF THE PLURALITY OF MEMRISTIVE DOT-PRODUCT CIRCUITS OF A CLUSTER OF THE PLURALITY OF CLUSTERS, A DOT PRODUCT OPERATION WITH RESPECT TO A SUB-MATRIX AND THE VECTOR
708

*FIG. 7*

MEMRISTIVE DOT PRODUCT CIRCUIT BASED FLOATING POINT COMPUTATIONS

BACKGROUND

A variety of memory devices may be capable of performing computations. For example, memory devices may perform operations, such as, analog multiply accumulate operations. Based on the performance of such operations, memory devices may accelerate performance of workloads.

BRIEF DESCRIPTION OF DRAWINGS

Features of the present disclosure are illustrated by way of example and not limited in the following figure(s), in which like numerals indicate like elements, in which:

FIG. 7 illustrates an example flowchart of a method for performing memristive dot product circuit based floating point computations.

DETAILED DESCRIPTION

Figure 1:
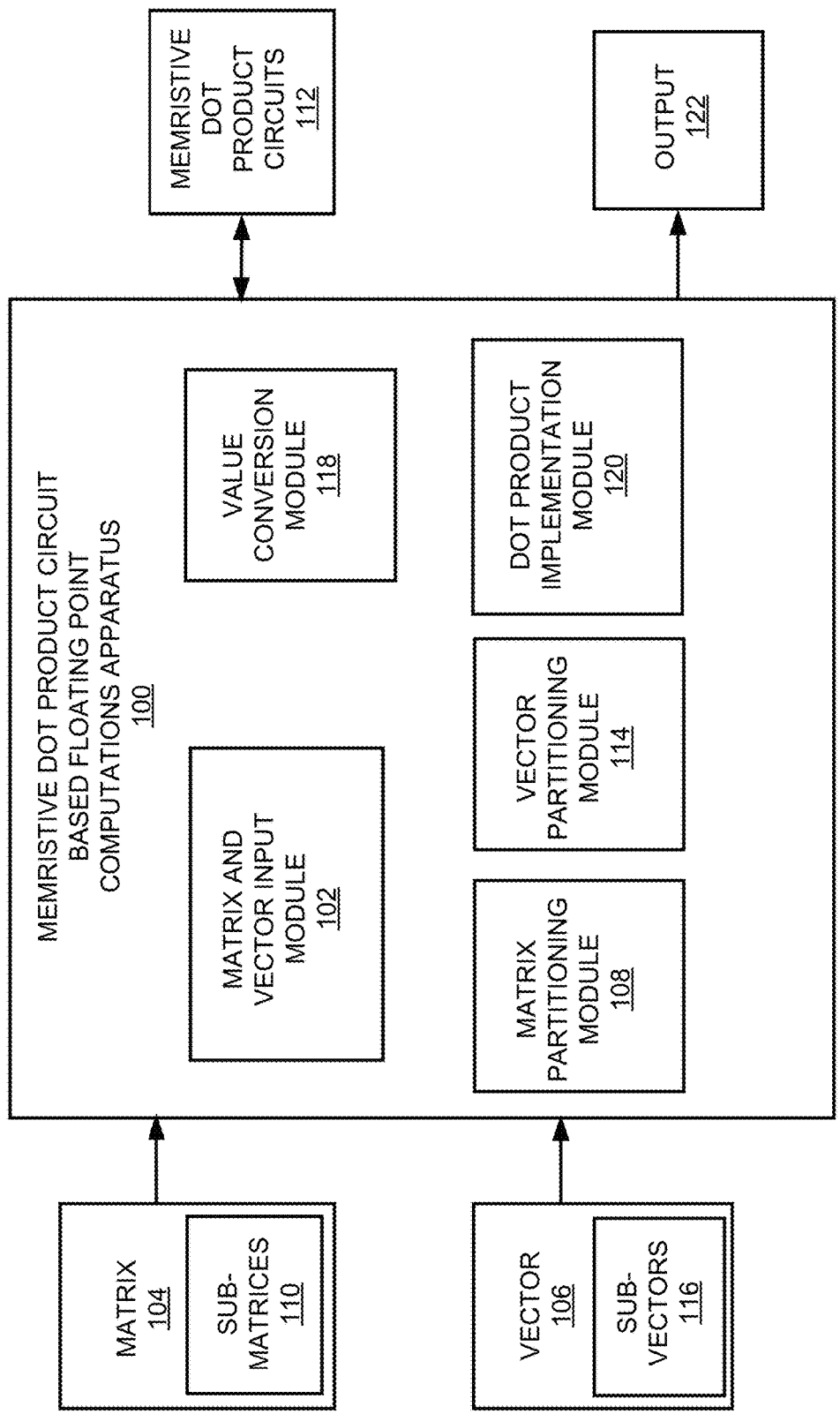
FIG. 1 illustrates an example layout of a memristive dot product circuit based floating point computations apparatus.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Apparatuses for memristive dot product circuit based floating point computations, methods for memristive dot product circuit based floating point computations, and non-transitory computer readable media having stored thereon machine readable instructions to provide memristive dot product circuit based floating point computations are disclosed herein. The apparatuses, methods, and non-transitory computer readable media disclosed herein provide for the efficient handling of floating point numbers when performing matrix-vector multiplications.

Workloads, such as scientific workloads, may use floating point and double representations for matrix and vector elements. A dot product engine, which may be formed of a dot product circuit, may be used to perform matrix-vector multiplications for fixed point numbers. Matrix-vector multiplications may include a relatively large number of multiply-accumulate operations. A dot product engine may rely on Kirchoffs law to perform the multiply-accumulate operations in an analog manner. The dot product engine may implement a grid of resistances, where, when input voltages are applied to wordlines, bitline currents may represent the dot products of the input voltages and cell conductances in an associated column, thus leveraging Kirchoff's Law for analog computation. With respect to matrix-vector multiplications, the matrix values may be written into the dot product engine, and may be involved in many subsequent matrix-vector multiplications without needing any further data movement for the matrix. By performing in-situ operations, the dot product engine may reduce the relatively high operational cost of moving datasets between a memory system and computational elements.

For floating point values, it is technically challenging to implement a dot product engine to perform matrix-vector multiplications. For example, if floating point values are converted to fixed point numbers, this conversion may increase dot product engine overhead, and reduce computational efficiency.

With respect to the apparatuses, methods, and non-transitory computer readable media disclosed herein, when input elements to be analyzed using a dot product engine are floating point or double, such elements may need to be converted to fixed point numbers such that their mantissas are aligned. For example, for a base 10 floating point format with a two digit mantissa, 1200 may be represented as $1.2*10^3$, and 0.13 may be represented as $1.3\ 10^{-1}$. With aligned mantissas, the corresponding fixed point values may be represented as 120000 and 000013 respectively, which may then be partitioned into bitslices and mapped to dot product engines. In order to enforce alignment, in addition to the bits representing the mantissa, additional bits may be needed for padding, and the number of bits padded may be a function of a difference between the exponent values. In certain cases, this padding operation may utilize 278 bits for single precision and over 2000 bits for double precision numbers. For example, for a 2 bit memristor cell for a dot product engine, up to 1024 dot product engines may be needed to perform a calculation on doubles. In this regard, while a majority of workloads may rely on floating point and double, the relative difference between elements may be less. That is, the occurrence of a matrix element of a value such as $2^{38}$, and an adjacent value in the opposite spectrum of $2^{-38}$ may include a low probability. This aspect may be leveraged as disclosed herein to increase the efficiency of floating point calculations, and to address the aforementioned technical challenges related to implementation of a dot product engine to perform matrix-vector multiplications.

Thus, the apparatuses, methods, and non-transitory computer readable media disclosed herein may address the aforementioned technical challenges by implementing a memristive dot product circuit architecture that reduces the need for fixed point numbers, and also reduces a number of memristive dot product circuits. Further, the apparatuses, methods, and non-transitory computer readable media disclosed herein may provide an efficient reduction network to reduce a peripheral circuit specification of a memristive dot product circuit cluster. The apparatuses, methods, and non-transitory computer readable media disclosed herein provide for the support for any arbitrary precision, for example, from 1 bit to >2000 bits. Further, the apparatuses, methods, and non-transitory computer readable media disclosed herein provide for handling of high precision floating point values and sparse matrices within an analog, in-situ resistive array.

The apparatuses, methods, and non-transitory computer readable media disclosed herein may reduce a dot product engine need for double and single precision floating point numbers. For example, by truncating and adjusting the significant bit position, accuracy may be maximized, and the shifter and adder specifications may be reduced at each h-tree node in a dot product engine cluster. Further, the apparatuses, methods, and non-transitory computer readable media disclosed herein may support any arbitrary precision (e.g., single and/or double precision).

In examples described herein, module(s), as described herein, may be any combination of hardware and programming to implement the functionalities of the respective module(s). In some examples described herein, the combinations of hardware and programming may be implemented in a number of different ways. For example, the programming for the modules may be processor executable instructions stored on a non-transitory machine-readable storage medium and the hardware for the modules may include a processing resource to execute those instructions. In these examples, a computing device implementing such modules may include the machine-readable storage medium storing the instructions and the processing resource to execute the instructions, or the machine-readable storage medium may be separately stored and accessible by the computing device and the processing resource. In some examples, some modules may be implemented in circuitry.

FIG. 1 illustrates an example layout of a memristive dot product circuit based floating point computations apparatus (hereinafter also referred to as "apparatus 100").

Referring to FIG. 1, the apparatus 100 may include a matrix and vector input module 102 to ascertain a matrix 104 and a vector 106 including floating point values.

A matrix partitioning module 108 may partition the matrix 104 into a plurality of sub-matrices 110 according to a size of a plurality of memristive dot product circuits 112.

A vector partitioning module 114 may partition the vector 106 into a plurality of sub-vectors 116 according to the partitioning of the matrix 104.

For each sub-matrix of the plurality of sub-matrices 110, a value conversion module 118 may convert the floating point values for the matrix to fixed point values. Similarly, for each sub-vector of the plurality of sub-vectors, the value conversion module 118 may convert the floating point values for the vector to fixed point values.

A dot product implementation module 120 may perform, based on the conversion and selected ones of the plurality of memristive dot product circuits 112, a dot product operation with respect to a sub-matrix and the vector 106. In this regard, each ones of the plurality of memristive dot product circuits 112 may include rows including word line voltages corresponding to the floating point values of the vector, conductances corresponding to the floating point values of an associated sub-matrix, and columns that include bitline currents corresponding to dot products of the voltages and conductances.

The dot product implementation module 120 may generate an output 122 that includes results of the dot product operation with respect to the matrix 104 and the vector 106.

Further, according to examples disclosed herein, the plurality of memristive dot product circuits 112 may be disposed in a plurality of clusters. In this regard, the dot product implementation module 120 may perform, using memristive dot product circuits of a cluster of the plurality of clusters, the dot product operation on a corresponding sub-matrix of the plurality of sub-matrices.

Figure 2:
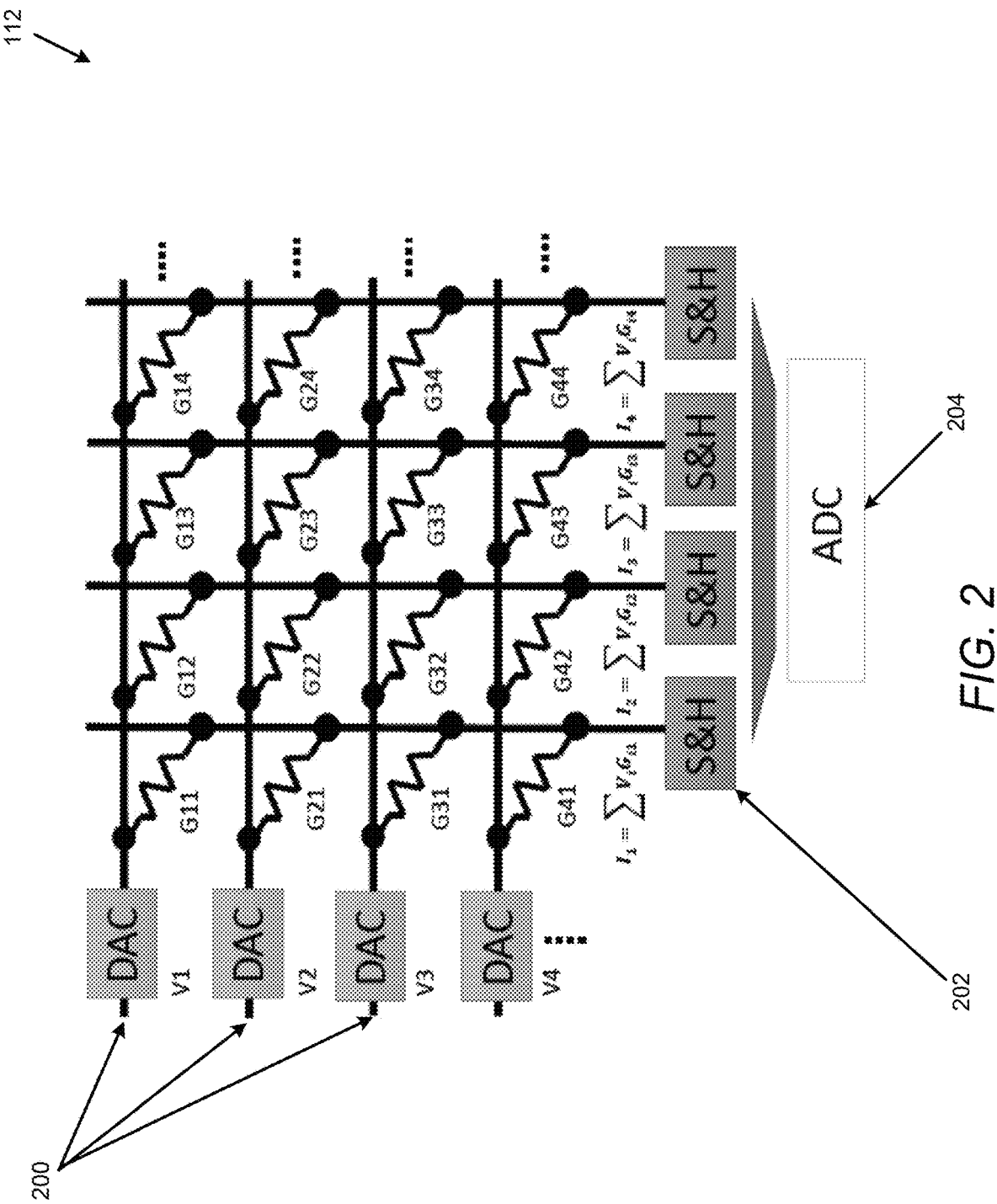
FIG. 2 illustrates an example layout of a memristive dot product circuit for performing floating point computations, for the memristive dot product circuit based floating point computations apparatus of FIG. 1.

FIG. 2 illustrates an example layout of a memristive dot product circuit 112 for performing floating point computations. The circuit 112 may also be referred to as circuits 112 (as shown in FIG. 1) when a plurality of circuits are utilized, for example, in a cluster configuration as disclosed herein.

Referring to FIG. 2, at 200, each row of the circuit 112 may include a digital-to-analog (DAC) converter to provide different wordline voltages (e.g., V1, V2, V3, etc.) based on an input vector to be multiplied. Each of the wordline voltages may be multiplied by a specified conductance (e.g., G11, G12, ..., G21, G22, etc.) to generate a current (e.g., I1, I2, etc.). When multiple rows of the circuit 112 are activated, associated currents may be aggregated to generate a dot product of a voltage vector and a conductance vector. The plurality of rows and columns of conductances as shown may represent a conductance matrix. At 202, each column may include a transimpedance amplifier (illustrated in FIG. 2 as a sample-and-hold (S&H) amplifier), which in turn may be connected to an analog-to-digital converter (ADC) at 204 to digitize the bitline current (e.g., for vertically connected cells). In order to reduce the area needed by the ADC, the ADC may be operated at a higher frequency and time multiplexed across multiple bitlines. A set of configuration registers may specify the number of valid output bits ($N_o$) from the ADC, the number of simultaneous rows that may be activated ($N_R$), and bit density of cells ($C_b$). These configuration registers may be used to dynamically tailor the circuit 112 to different applications.

According to examples disclosed herein, the circuit 112 may include a relatively high ON/OFF ratio (e.g., ($10^5$)) for cells to increase the precision of read/write operations.

In order to perform a matrix vector multiplication operation, e.g., $\vec{a} \cdot B$, every element of matrix B may be programmed to its equivalent analog conductance state of the memristors G. The input vector ($\vec{a}$) may be converted to analog input vector voltages $V_i$ by the DACs. Each element of B may be represented by a memristor cell, and the input vector elements may be converted to a single analog value using DACs. The mapping process may begin with scanning of matrix elements for the highest (h) and the lowest (l) values. These values may correspond to the minimum and maximum resistances of a memristor cell. Every other element may then be mapped to a resistance according to its ratio with h and l. The output current may be collected by the transimpedance amplifier at each column with a reference resistance RS. The output current $I_O = \Sigma V_i \cdot G_i$ may directly reflect the corresponding dot product operation. This value may then be digitized using the ADC at 204.

Parameters of the circuit 112, such as the number of levels in a cell, analog to digital converter specification (e.g., ADC bits), digital to analog converter specification (e.g., size of input bits to DAC), and the size of an array may be coupled to each other. In order to avoid data loss, for the ADC specification, as disclosed herein, $N_R$ may represent the number of rows activated in dot product engine mode, $DAC_b$ may represent the input bit width of a DAC, and $M_b$ may represent the number of bits stored in a memristor cell as follows:

$$ADCbits = \begin{cases} \log2(N_R) + DAC_b + M_b & \text{if } DAC_b > 1 \\ \log2(N_R) + M_b & \text{if } DAC_b = 1 \\ \log2(N_R) + DAC_b & \text{if } M_b = 1 \end{cases}$$

According to examples disclosed herein, the circuit 112 may utilize a closed loop write circuit with current compliance to perform program-and-verify operations to fine tune cells. The circuit 112 may utilize "1T1R" cells that reduce density, as well as avoiding sneak currents. For the circuit 112, a cell's resistance may deviate within a tolerable range. This range may limit either the number of levels in a cell or the number of simultaneously active rows in the circuit 112. For example, if a cell write can achieve a resistance within $\Delta r$ (where $\Delta r$ is a function of noise and parasitic), if l is the number of levels in a cell, and $r_{range}$ is the maximum range of resistance of a cell, then the number of active rows may be set to $r_{range}/(l \cdot \Delta r)$ to ensure that there are no corrupted bits at the ADC.

A matrix vector multiplication operation may be large enough that it may need to be divided across multiple such circuits 112. Therefore, as disclosed herein, results of a number of circuits 112 may need to be aggregated with an on-chip network and digital arithmetic-logic units (ALUs). Since the circuit 112 may handle fixed-point arithmetic, as disclosed herein, a conversion from floating-point format to fixed-point format may be needed during initialization. With respect to sparse matrices, a sparse matrix may result in a sparse degree of parallelism within the circuit 112. In this regard, as disclosed herein, the circuit 112 may include an organization where sparse matrices may be mapped to rows and columns of the circuit 112. Further, as disclosed herein, the circuit 112 may handle negative numbers in both input vectors and matrix values with minimal overhead. Moreover, as disclosed herein, the circuit 112 may be implemented to handle errors.

The circuit 112 disclosed herein may be integrated into a general purpose system to provide an accelerator as disclosed herein with reference to FIGS. 4A-4E. In this regard, non-matrix-vector multiplication computations may be executed on a host processor, while matrix-vector multiplication computations may be off-loaded to the circuit 112 that may be part of the main memory system.

Before off-loading a matrix-vector multiplication computation to the circuit 112, the host processor may initialize the cells of the circuit 112 with the appropriate matrix values. The input vector may be provided by the host to an accelerator buffer. These buffers may be made part of the physical memory and hence, may be accessed by the host processor. The host processor may implement memory-mapped input/output to initiate the matrix-vector multiplication.

Figures 3A, 3B, 3C:
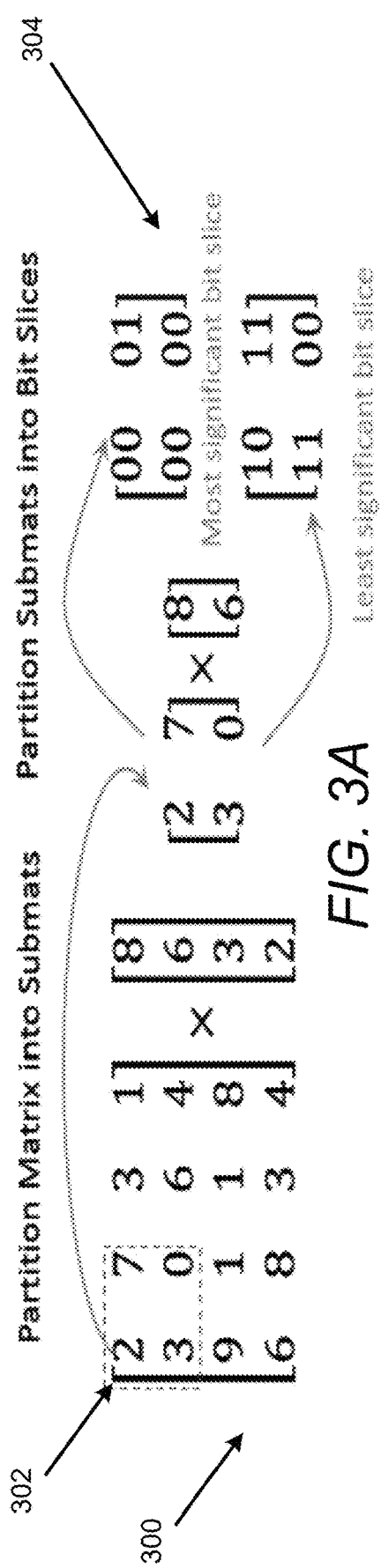
FIGS. 3A-3C illustrate an example of mapping a 4×4 matrix onto a system with a 2×2 circuit, such as the 4×4 memristive dot product circuit for performing floating point computations of FIG. 2, with two bits per cell.

FIGS. 3A-3C illustrates an example of mapping a 4×4 matrix onto a system with a 2×2 circuit, such as the 4×4 circuit 112 of FIG. 2, with two bits per cell.

With respect to a matrix partitioning, a relatively large matrix may be divided into a set of sub-matrices (also referred to as "submats"), where a submat may be described as a contiguous section with dimensions similar to or smaller than the circuit 112 (e.g., the 4×4 circuit 112 of FIG. 2). For example, for a 2×2 circuit 112, FIG. 3A illustrates an example 4×4 matrix 300 (e.g., the matrix 104 of FIG. 1) being divided into four submats, with one submat illustrated at 302 (e.g., one of the sub-matrices 110 of FIG. 1). As the matrix elements vary from 0-15, four bits may be used to represent each element. Since each memristor cell in this example may store 2 bits, a submat may be further divided into bit slices as shown at 304 in FIG. 3B. Two circuits 112 (e.g., illustrated as dot product engine (DPE1 and DPE2)) may be needed to represent a single submat. Each of the two circuits 112 may be fed with the same 4 bit input vector values (e.g., fora 4 bit DAC). Once each DPE has produced its bit slice result in parallel, the corresponding 7 bit outputs may be shifted and added at 306 to generate the final output from that submat. As shown at 308 in FIG. 3C, the outputs of multiple submats may be aggregated to generate the final output vector.

With respect to partitioning of the input vector 106, the input vector value may need more bits than those specified by the DAC's resolution. In such cases, the input vector 106 may also be partitioned into bit-slices based on DAC resolution ($DAC_b$), and the partial results may be combined using similar shift and add operations as disclosed herein with reference to FIGS. 3A-3C.

FIGS. 4A-4E illustrate an accelerator architecture using 128×128 circuits, such as the circuit 112, 8 bit analog-to-digital converters, 2 bits per cell, and multiple circuits per cluster.

Referring to FIG. 1, as disclosed herein, the plurality of memristive dot product circuits 112 may be disposed in a plurality of clusters. In this regard, the dot product implementation module 120 may perform, using memristive dot product circuits of a cluster of the plurality of clusters, the dot product operation on a corresponding sub-matrix of the plurality of sub-matrices. In this regard, referring to FIGS. 4A and 4B, with respect to management of clusters, an overall accelerator organization is illustrated, where an accelerator 400 may include multiple clusters 402 to operate on various submats in parallel. In this regard, with respect to submat computation with a cluster of circuits 112, a hierarchical architecture may be implemented to process a partitioned matrix (e.g., a submat). The hierarchical architecture may be reconfigurable to support different problem sizes, precision specifications (e.g., floating point, double, or arbitrary precision), and negative numbers. In this regard, a set of circuits 112 used to evaluate a submat may be referred to as a cluster as shown at 404 (e.g., where the cluster at 404 includes four circuits 112). Since an entire submat may operate on the same vector elements, as shown at 406, a single DAC array that supplies input vector elements may be shared across the circuits 112 within a cluster.

With respect to intra-cluster h-trees, as shown at 408, the circuits 112 within a cluster may be connected together by an active h-tree network in which every joint includes a reconfigurable shift and add unit. Thus, each joint in the h-tree may perform an add operation instead of the shift-and-add performed within a cluster as shown at 410, and also disclosed herein with respect to FIGS. 3A-3C. The reconfigurable shift and add units may support variable shift size, and may allow truncation of results to a configurable number of bits. Thus, the final result through the h-tree may represent the product of a submat and the corresponding section of the input vector with all the bits.

Figures 4A, 4B:
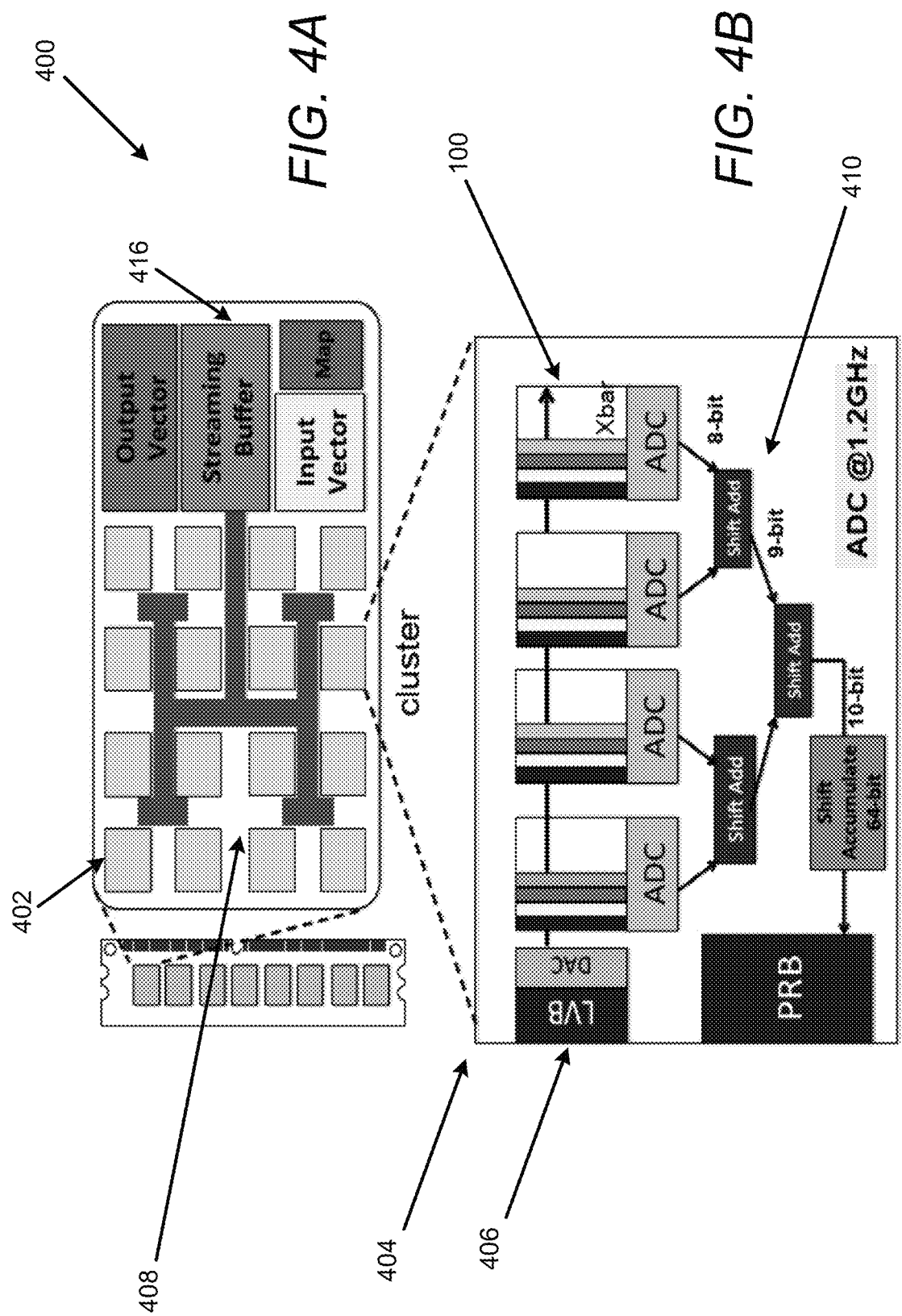
FIGS. 4A-4E illustrate an accelerator architecture using 128×128 circuits, such as the memristive dot product circuit for performing floating point computations of FIG. 2, 8 bit analog-to-digital converters, 2 bits per cell, and multiple circuits per cluster.

With respect to buffers in a cluster, other than components of the circuit 112 and h-tree, as shown in FIG. 4B, a cluster may also include a local vector buffer (LVB) and a partial result buffer (PRB) to store the input and buffer intermediate outputs. The local vector buffer may store the part of the input vector that operates on the submat mapped to that cluster. For each iteration (or circuit 112 operation), the local vector buffer may provide $DAC_b \times DPE_{rows}$ bits of data to the DAC array. The partial result buffer may be used to store and aggregate partial results from each input bit-slice. All components in the cluster may operate at the same rate as the ADC sampling rate so that the entire cluster may operate in lock step. Because of this lock-step behavior, a contention-free h-tree network may be utilized.

With respect to customization of a cluster, each cluster may be customizable to operate with a wide range of applications with different matrix dimensions and accuracy specifications. For example, circuit 112 specifications such as DAC bits ($DAC_b$), cell levels ($M_b$), ADC output, and shift size may be dynamically configured. For example, if the input matrix has a skewed aspect ratio with relatively few columns or rows, then some columns in the circuits 112 may not be utilized. The cell levels may be reduced to reduce ADC overhead, and to increase operational speed. Similarly, if some circuits 112 are not operational, then such circuits 112 may be disconnected by adjusting the shift-add size at h-tree joints.

With respect to handling of floating point numbers, the circuit 112 may perform computations for values including single and double precision floating point formats. In this regard, conversion from floating to fixed point may be more efficient if a set of values are converted together, and if the range of those values is known. The accelerator 400 may utilize the minimal difference between maximum and minimum values within a submat row to reduce average storage overhead. For example, for a base 10 floating point format with a two digit mantissa, 1200 may be represented as $1.2 \times 10^3$ and 0.13 may be represented as $1.3 \times 10^{-1}$. With aligned mantissas, the corresponding fixed point values are 120000 and 000013 respectively, which may then be partitioned into bitslices and mapped to circuits 112. In order to enforce alignment, in addition to the bits representing mantissa, additional bits may be needed for padding, and the number of bits padded may be a function of the difference between the exponent values. According to an example, 278 bits may be utilized for single precision (e.g., 254 bits for padding, 23 bits for mantissa, and 1 implied mantissa bit in the IEEE 754 standard), and over 2000 bits may be utilized for double precision numbers.

With respect to aligning relatively small groups of numbers, the relative difference between nearby elements may be relatively less than relatively extreme values (e.g., $10^{38}$ & $10^{-38}$). Moreover, since every row in a submat may operate independently, instead of aligning lowest and highest elements in a matrix, numbers within a submat row may be aligned. This may reduce the padding overhead to the difference between the minimum and maximum exponents within a submat row. Since every row may include a different alignment, a base exponent may be stored for each submat row in a cluster. Thus, each cluster may include $N_c$ base registers, where $N_c$ may represent the number of columns in a circuit 112. The set of vector elements operating within a cluster may be aligned separately in a similar manner with a different base exponent. When a cluster computes a submat row and vector product, the corresponding row and vector exponent values may be multiplied with the output before being sent through the global h-tree. With this optimization, the fixed point size may reduce to 160 bits.

With respect to handling of sparse matrices, an accelerator, such as the accelerator 400, based on the circuit 112 may operate on thousands of matrix elements stored in a grid-type format in-situ, and in parallel. In this regard, beyond a certain threshold (e.g., a matrix row with 1000 elements having 2 or 4 non-zero elements), it may be more efficient to read individual elements from the circuit 112, and perform computations using floating point units. This threshold may depend on both digital floating point overheads and the cost of converting back and forth between digital and analog values.

The partition scheme disclosed herein with respect to matrix partitioning may facilitate mapping of a matrix to accelerators, obviating the need for a complex tracking table. The partition scheme may also facilitate the aggregation of results from clusters, thus facilitating the control and data paths. When performing matrix-vector multiplication, almost all of the vector elements may be needed by each matrix row for computation. With the submat format, an h-tree, such as the h-tree at 408, which interconnects clusters may broadcast the vector elements to nearby clusters, incurring less bandwidth and area overheads.

Figures 4C, 4D, 4E:
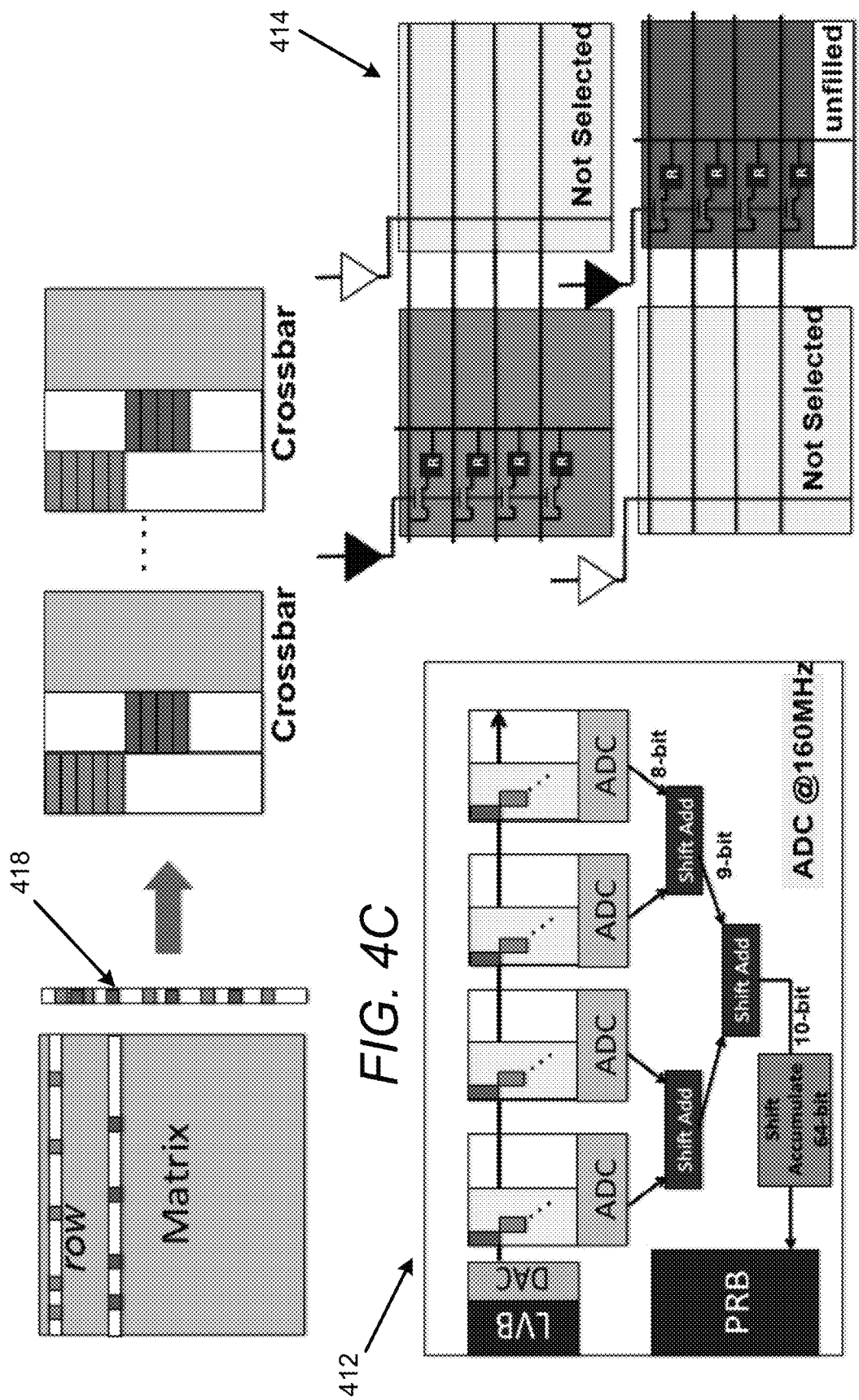

For sparse matrices, in order to maximize the utilization of cells of the circuit 112, instead of breaking a matrix into submats, each row of a sparse matrix may be processed entirely within a cluster. Thus each cluster may perform vector-vector multiplication instead of a submat-vector multiplication. In this regard, mapping of a matrix in the cluster may be modified as shown at 412 in FIG. 4D. Further, FIG. 4C shows how the data corresponding to a sparse row and vector is mapped. The shaded values at 418 may represent the non-zero values. The entire row may be mapped to a cluster. In this regard, a row size of a matrix may be larger than the crossbar size, but because of sparsity, the entire row may be mapped to a single crossbar. Every element of rows processed in a cluster may be mapped across circuits 112. With this arrangement, a shared DAC array may supply vector bits across circuits 112. However, since a single circuit 112 will have elements from multiple rows, with each row utilizing separate vector bits, not every DPE column output may be valid. Hence, a difference in operation between dense and sparse matrices is that for every operation (e.g., 100 ns access) of a circuit 112, a subset of columns may be decoded by an ADC. For example, if a row element is 64 bits, then each circuit 112 in a cluster may have 8 bits each, assuming 8 DPEs in a cluster, and each circuit 112 may be configured with a one bit cell. After operation of a circuit 112, an ADC may process those columns where these 8 bits are mapped. Hence, the operating speed of the circuit 112 may be a fraction of the operating speed needed for dense matrices.

When processing an entire row within a cluster, as the number of non-zero elements in each matrix row may be smaller than rows of a circuit 112, density may be increased by including multiple segments within the circuit 112, with each segment operating on different rows. In order to support segments of the circuit 112, a hierarchical wordline is shown at 414 in FIG. 4E. For the hierarchical wordline of FIG. 4E, in a first iteration, rows 1 and 2 may be processed, followed by rows 2 and 3 in the second iteration. The aggregation of bitslice results may continue to occur at the active h-tree and partial result buffer. When processing sparse matrix rows, even though each cluster throughput may be limited, as ADCs are operated at reduced frequency and hence power, it may be possible to have more active clusters for a given power budget, compared to a dense matrix.

Referring again to FIG. 4A, with respect to a streaming buffer 416, for sparse matrices, the accelerator 400 may utilize a non-blocking global h-tree to interconnect clusters. Vectors may be streamed from the central streaming buffer 416 to clusters with minimal buffering overhead in each cluster. Since accesses to the centralized streaming buffer 416 may benefit from high spatial locality, banking and interleaving of vectors across banks may provide high bandwidth. Additionally, as the same set of vector elements may be used by submats along a row, h-tree bandwidth utilization may be low. For a sparse matrix, since each cluster may operate on a different set of random vector elements, the streaming buffer 416 may support high bandwidth even for random accesses. In order to minimize increasing the complexity of a local vector buffer in each cluster, the streaming buffer 416 may be used to assemble vector elements of all active clusters, and distribute the assembled vector elements through the h-tree. Further, the h-tree bandwidth may need to be increased either with more links or by operating at higher frequency to send vectors to all active clusters.

With respect to handling of negative numbers by the circuit 112, the accelerator 400 may support negative numbers in both vector and matrices. In this regard, the circuit 112 may perform addition through accumulation of bit line current in the analog domain. The circuit 112 may handle negative numbers in the matrix with changes in the aforementioned mapping process, even though the summation occurs in the analog mode. For example, assuming that each input element is small enough to be mapped to a single memristor cell, the mapping process may begin with scanning of the matrix for the highest and lowest elements. These values may correspond to the maximum (h) and minimum (l) conductances of a cell. Every other element may then be mapped to a conductance according to its ratio with h and l. Thus, an element may be represented as x=a×x+b siemens, where a and b are constants. This mapping may be utilized with negative numbers with the lowest conductance being the smallest negative number. In order to obtain the final signed output, the output of the circuit 112 may be scaled back with a product of bias, and the total value of vector elements may be specified as follows:

$$SignedOutput = \left(DPE_{output} - b * \sum_{n=1}^{DPE_{rows}} DAC_n\right) / a$$

In order to determine the summation term involving input vector ($DAG_n$), each circuit 112 may be equipped with an additional column with all cells including a value of "1". The same process may be applicable when matrix elements are divided into multiple bitslices, except that the final scaling may be performed after combining all the matrix bitslice results through the active h-tree in a cluster. In order to handle negative numbers in the input vector, during the last iteration, a shift and subtraction may be performed instead of a shift and add with contents of a partial result buffer to obtain the final result. In this regard, referring to FIG. 1, the dot product implementation module 120 may perform, based on the conversion and selected ones of the plurality of memristive dot product circuits, the dot product operation with respect to the sub-matrix and the vector by performing, based on the mapping of each element of the sub-matrix to the corresponding memristive dot product circuit, a plurality of multiplication operations, and for each multiplication operation of the plurality of multiplication operations and for a negative floating point value of the floating point values, performing a shift and subtract operation to generate results of the plurality of multiplication operations.

With respect to initialization of the circuit 112, the complementary metal-oxide-semiconductor compatibility of the circuit 112, as well as the 1T1R cell design may increase write bandwidth. For a given power specification, the write bandwidth of a memory may be based on the number of independent banks (e.g., circuits 112), and write latency per circuit 112. For the circuit 112, the use of 1T1R cells with a dedicated access transistor may eliminate sneak currents, and may further facilitate the writing of additional cells within a power specification.

With respect to cell failures associated with the circuit 112 and the accelerator 400, every buffer and datapath in the accelerator may be protected by parity bits. The circuit 112 may include transistors to eliminate sneak currents when performing reads and writes. A program-and-verify write scheme may be implemented to tune each cell of the circuit 112, and verify the writing process to ensure correctness. Spare circuits 112, and spare clusters may be provided for redundancy in the event of failure. If the number of failed cells within a circuit 112 exceeds the spare rows and columns, the size of the problem being handled by that cluster may be downsized to avoid using the defective circuit 112.

Figure 5:
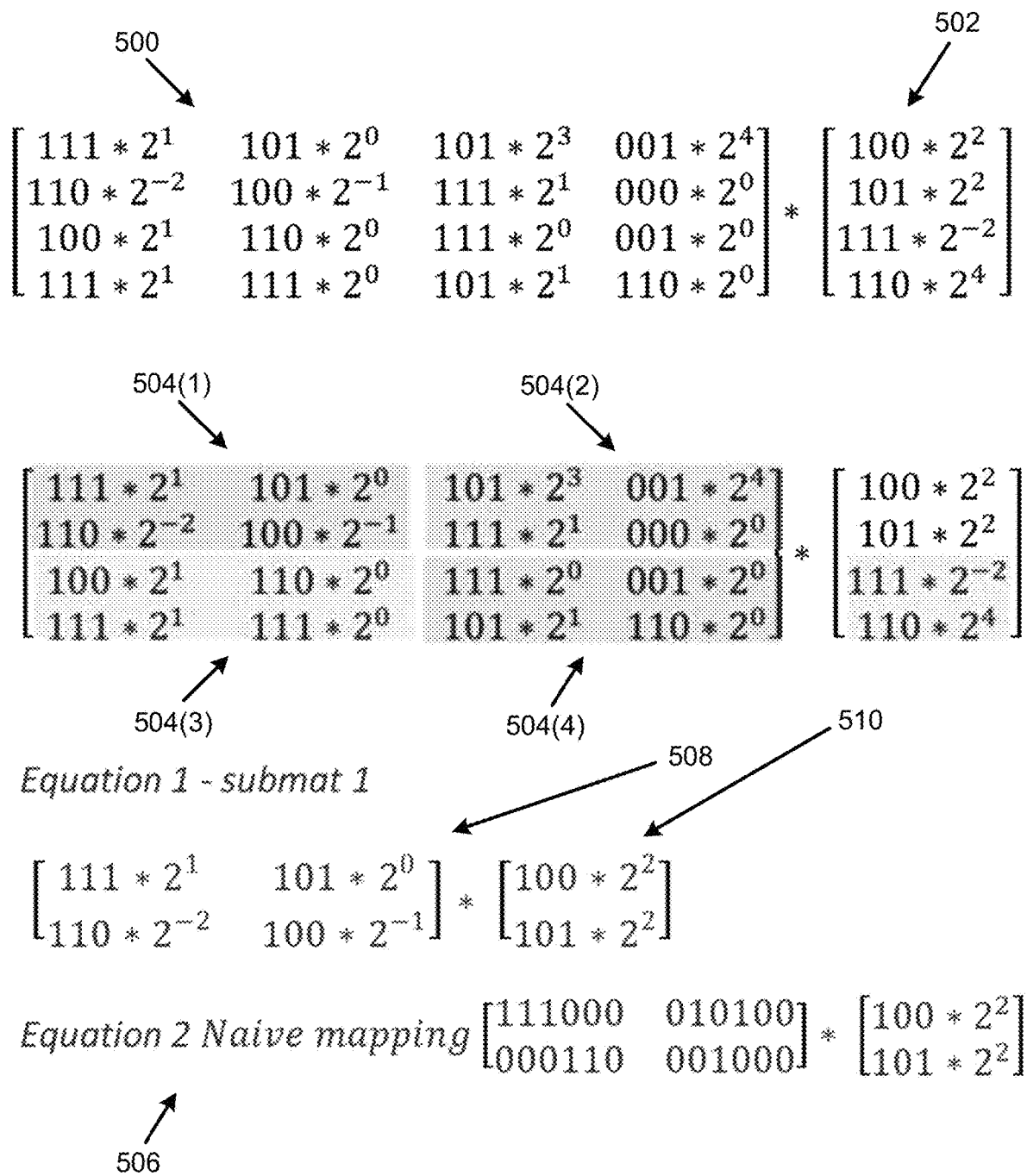
FIG. 5 illustrates an example of operation of the memristive dot product circuit based floating point computations apparatus of FIG. 1, where the operation includes a 4×4 matrix and a 4×1 vector multiplication.
Figure 5:
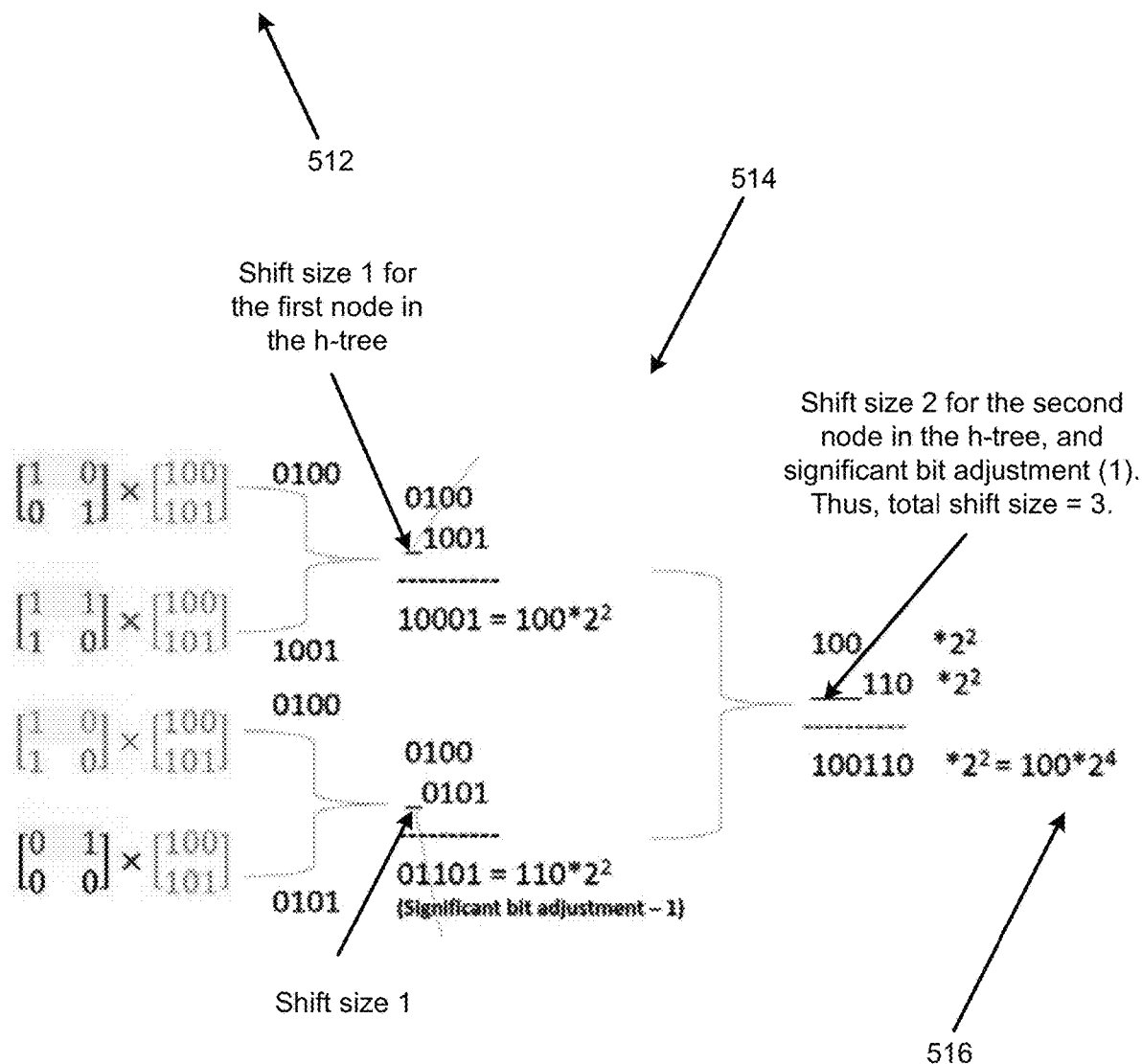

FIG. 5 illustrates an example of operation of the apparatus 100, where the operation includes a 4×4 matrix and a 4×1 vector multiplication.

Referring to FIG. 5, according to an example, single precision floating point may support 23 bits of decimals. However, a simplified example presented herein is based on a total number of supported bits being 3 bits. For the example of FIG. 5, for a circuit 112 of a size 2×2, each cell in the circuit 112 may store one bit. For the example of FIG. 5, the DAC precision may be specified as 3 bits. The matrix-vector operation to be performed may include a matrix and a vector shown respectively at 500 and 502 (e.g., the matrix 104 and the vector 106 of FIG. 1). Since the circuit 112 is of a 2×2 size, the matrix at 500 may be partitioned into submats of size 2×2 as shown at 504(1), 504(2), 504(3), and 504(4). As disclosed herein, for a configuration including a plurality of clusters (e.g., the accelerator 400 of FIG. 4A), each cluster may operate on a given submat.

Referring to submat1 at 504(1), the submat1 may be converted into fixed point by using six bits for each element as shown at 506. With the 2×2 circuit 112, with one bit cells, six circuits 112 may be needed. For alignment within a single row, the submat calculation may be implemented as follows.

As a first step, mantissas may be aligned and padded within a row in a submat. In this regard, referring to FIGS. 1 and 5, the dot product implementation module 120 may perform, based on the conversion and selected ones of the plurality of memristive dot product circuits, the dot product operation with respect to the sub-matrix and the vector by aligning, for each sub-matrix of the plurality of sub-matrices, mantissas of the fixed point values of the associated sub-matrix, and modifying the fixed point values of the associated sub-matrix with the aligned mantissas to include an equal length. Separately, vector elements may be aligned within a section that will be used in a submat calculation. In this regard, referring to FIGS. 1 and 5, the vector partitioning module 114 may partition the vector into a plurality of sub-vectors 116 according to the size of the plurality of memristive dot product circuits, and for each sub-vector of the plurality of sub-vectors, convert the floating point values to fixed point values. For the example of FIG. 5, for each submat (e.g., submat1 at 504(1) illustrated at 508), submat row one may need four bits in the first row and four bits in the second row. However, the scaling factor in the first row may be specified as $2^0$ and the scaling factor in the second row may be specified as $2^{-1}$. For the vector elements at 510, the first two elements may be needed for submat1, and for the example of FIG. 5, these elements are shown as aligned since their exponents have the same value ($2^2$). The submat elements after scaling are illustrated at 512.

As a second step, since the circuit 112 for the example of FIG. 5 supports one bit cells, each element in the submat may be divided into four bitslices and mapped to four different circuits 112 as shown at 514. In this regard, referring to FIGS. 1 and 5, the dot product implementation module 120 may perform, based on the conversion and selected ones of the plurality of memristive dot product circuits, the dot product operation with respect to the sub-matrix and the vector by determining, for each sub-matrix of the plurality of sub-matrices, a number of bit cells supported by the selected ones of the plurality of memristive dot product circuits, and mapping, based on the determined number of bit cells, each element of a sub-matrix to a corresponding memristive dot product circuit.

As a third step, computations associated with the first row calculated using the submat are described (the process is the same for the second row). The circuit 112 may determine the multiplication of the vector with the 1 bit elements as disclosed above. After the first cycle, the first circuit 112 will output 0100, the second circuit 112 will output 1001, and so forth. These values may be sent through the h-tree, and at the first node of the h-tree, the output of the first circuit 112 and the output of the second circuit 112 may be combined by a shift and add. In this regard, referring to FIGS. 1 and 5, the dot product implementation module 120 may perform, based on the conversion and selected ones of the plurality of memristive dot product circuits, the dot product operation with respect to the sub-matrix and the vector by performing, based on the mapping of each element of the sub-matrix to the corresponding memristive dot product circuit, a plurality of multiplication operations, and for each multiplication operation of the plurality of multiplication operations, performing a shift and add operation to generate results of the plurality of multiplication operations. In parallel, outputs of a third circuit 112 and a fourth circuit 112 may be combined in a similar manner. While the process may be the same for any operation, a differentiator in the floating point operation is that, after the shift and add, the results may be truncated to "N" bits. For the example of FIG. 5, since the DAC precision is specified as 3 bits, the truncation may be performed to 3 bits. In a single precision floating point number, this will be 24 bits. The truncation may be performed such that, the number of bits may be counted starting from a non-zero value (e.g., 1) in the most significant bit (MSB). For example, when merging results 0100 and 0101 from the third circuit 112 and the fourth circuit 112, the full result is 01101. According to an example, the truncation may be performed to $011*2^2$. According to another example, in order to maximize precision, the truncation may be performed to $110*2^2$, and the significant bit adjustment may be tracked in the h-tree.

As a fourth step, in the next h-tree node, as results from the first h-tree node are merged, in addition to the actual shift, the significant bit adjustment may be accounted for to accurately reflect the bitslice position in the result. In this regard, referring to FIGS. 1 and 5, the dot product implementation module 120 may perform, based on the conversion and selected ones of the plurality of memristive dot product circuits, the dot product operation with respect to the sub-matrix and the vector by combining the results of the plurality of multiplication operations to generate a combined result, and adjusting, based on a bitslice position, a position of a significant bit of the combined result.

As a fifth step, the final truncated result $100*2^4$ at 516 may be adjusted with the submat scale and vector scale noted in the first step. Thus, the actual value may become $100*2^4*2^0*2^2=100*2^6$. In this regard, referring to FIGS. 1 and 5, the dot product implementation module 120 may perform, based on the conversion and selected ones of the plurality of memristive dot product circuits, the dot product operation with respect to the sub-matrix and the vector by adjusting the combined result based on a scale associated with the sub-matrix.

Figure 6:
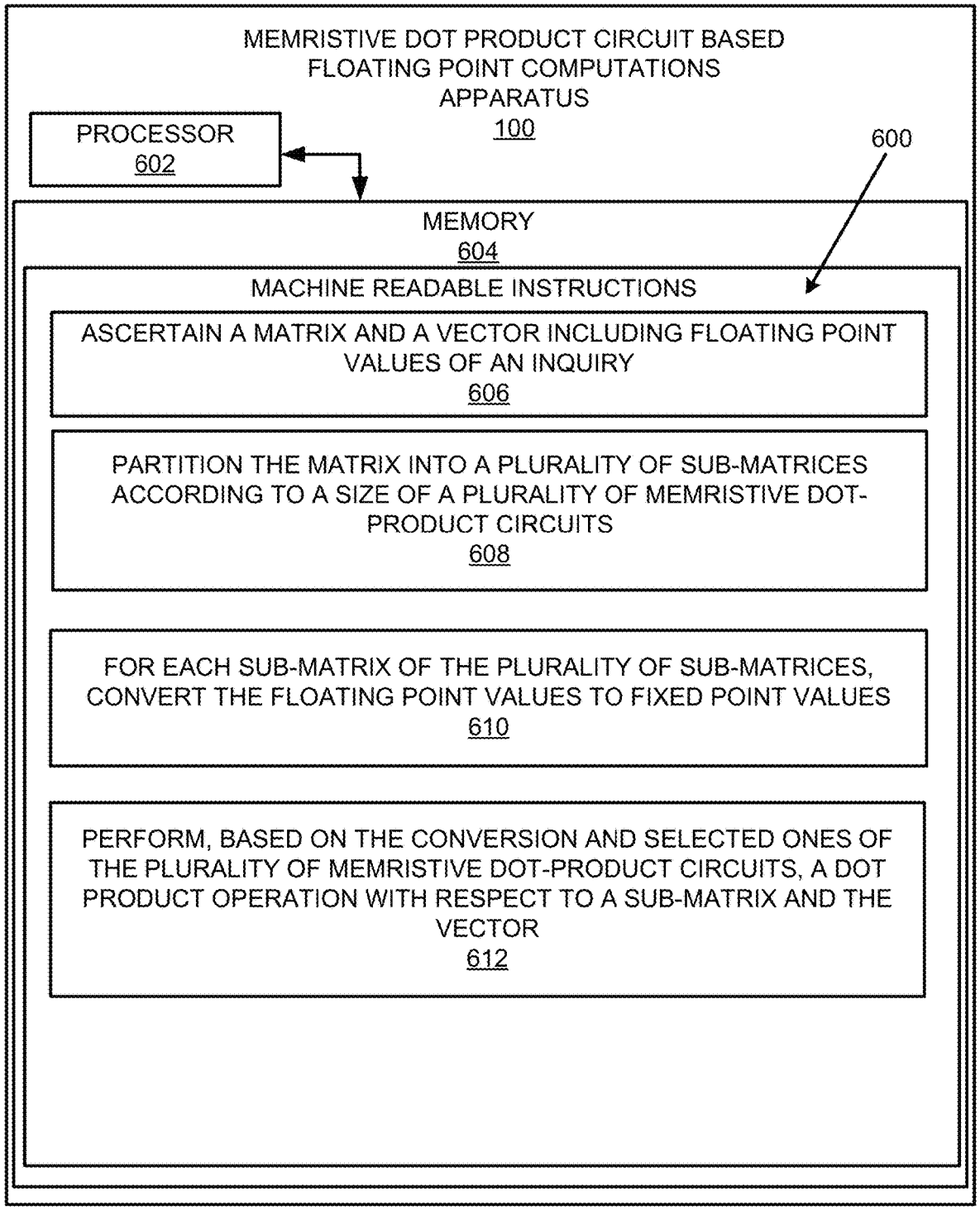
FIG. 6 illustrates an example block diagram for performing memristive dot product circuit based floating point computations.
Figure 8:
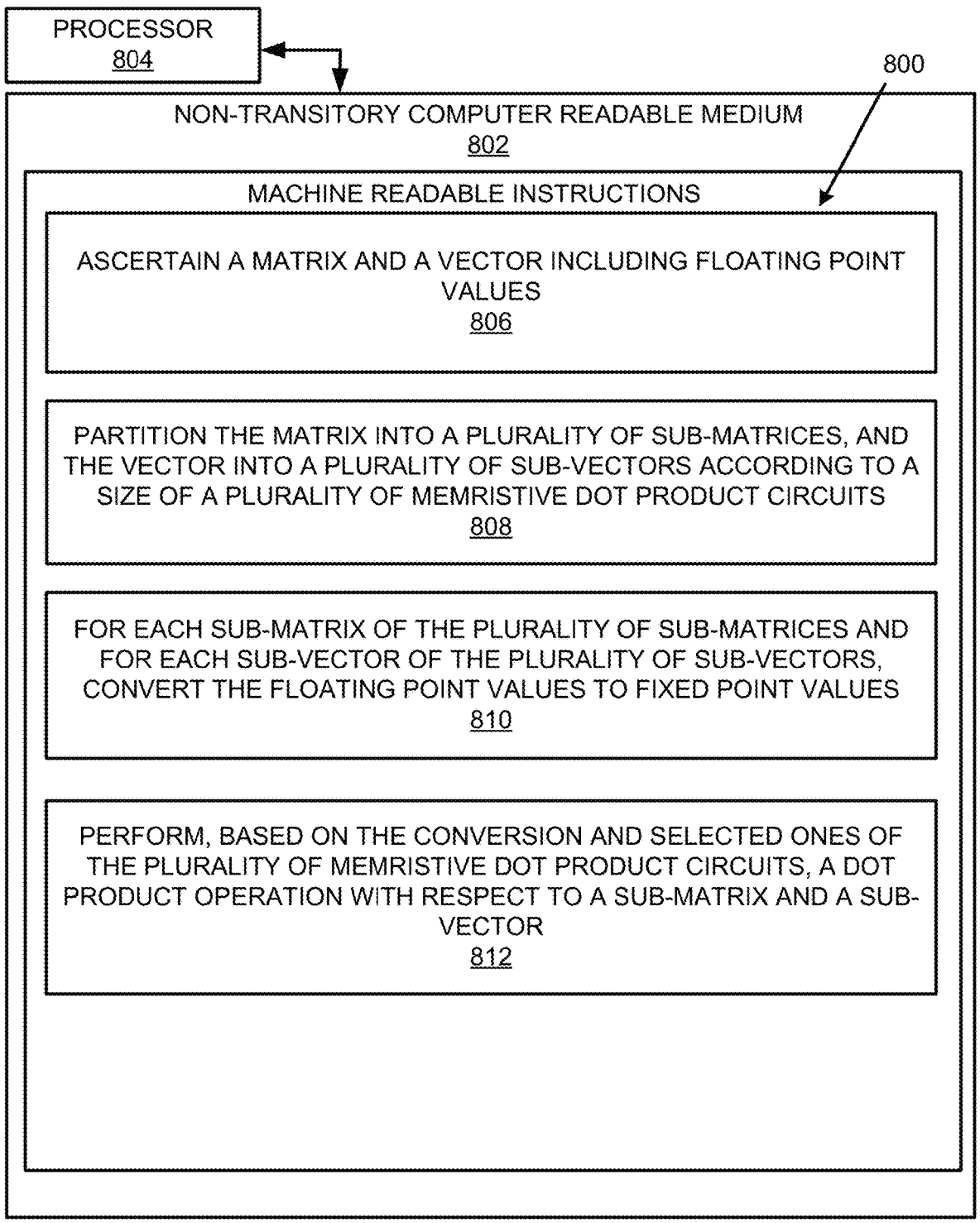
FIG. 8 illustrates a further example block diagram for performing memristive dot product circuit based floating point computations.

FIGS. 6-8 respectively illustrate an example block diagram 600, an example flowchart of a method 700, and a further example block diagram 800 for memristive dot product circuit based floating point computations. The block diagram 600, the method 700, and the block diagram 800 may be implemented on the apparatus 100 described above with reference to FIG. 1 by way of example and not limitation. The block diagram 600, the method 700, and the block diagram 800 may be practiced in other apparatus. In addition to showing the block diagram 600, FIG. 6 shows hardware of the apparatus 100 that may execute the instructions of the block diagram 600. The hardware may include a processor 602, and a memory 604 (i.e., a non-transitory computer readable medium) storing machine readable instructions that when executed by the processor 602 cause the processor to perform the instructions of the block diagram 600. The memory 604 may represent a non-transitory computer readable medium. FIG. 7 may represent a method for performing memristive dot product circuit based floating point computations. FIG. 8 may represent a non-transitory computer readable medium 802 having stored thereon machine readable instructions to perform memristive dot product circuit based floating point computations. The machine readable instructions, when executed, cause a processor 804 to perform the instructions of the block diagram 800 also shown in FIG. 8.

The processor 602 of FIG. 6 and/or the processor 804 of FIG. 8 may include a single or multiple processors or other hardware processing circuit, to execute the methods, functions and other processes described herein. These methods, functions and other processes may be embodied as machine readable instructions stored on a computer readable medium, which may be non-transitory (e.g., the non-transitory computer readable medium 802 of FIG. 8), such as hardware storage devices (e.g., RAM (random access memory), ROM (read only memory), EPROM (erasable, programmable ROM), EEPROM (electrically erasable, programmable ROM), hard drives, and flash memory). The memory 604 may include a RAM, where the machine readable instructions and data for a processor may reside during runtime.

Referring to FIGS. 1-6, and particularly to the block diagram 600 shown in FIG. 6, the memory 604 may include instructions 606 to ascertain a matrix 104 and a vector 106 including floating point values.

The processor 602 may fetch, decode, and execute the instructions 608 to partition the matrix 104 into a plurality of sub-matrices according to a size of a plurality of memristive dot product circuits 112.

For each sub-matrix of the plurality of sub-matrices, the processor 602 may fetch, decode, and execute the instructions 610 to convert the floating point values to fixed point values.

The processor 602 may fetch, decode, and execute the instructions 612 to perform, based on the conversion and selected ones of the plurality of memristive dot product circuits 112, a dot product operation with respect to a sub-matrix and the vector 106.

Referring to FIGS. 1-5 and 7, and particularly FIG. 7, for the method 700, at block 702, the method may include ascertaining a matrix 104 and a vector 106 including floating point values.

At block 704, the method may include partitioning the matrix 104 into a plurality of sub-matrices according to a size of a plurality of memristive dot product circuits 112 that are disposed in a plurality of clusters.

At block 706, for each sub-matrix of the plurality of sub-matrices, the method may include converting the floating point values to fixed point values.

At block 708, the method may include performing, based on the conversion and selected ones of the plurality of memristive dot product circuits 112 of a cluster of the plurality of clusters, a dot product operation with respect to a sub-matrix and the vector 106.

Referring to FIGS. 1-5 and 8, and particularly FIG. 8, for the block diagram 800, the non-transitory computer readable medium 802 may include instructions 806 to ascertain a matrix 104 and a vector 106 including floating point values.

The processor 804 may fetch, decode, and execute the instructions 808 to partition the matrix 104 into a plurality of sub-matrices, and the vector 106 into a plurality of sub-vectors according to a size of a plurality of memristive dot product circuits 112.

For each sub-matrix of the plurality of sub-matrices and for each sub-vector of the plurality of sub-vectors, the processor 804 may fetch, decode, and execute the instructions 810 to convert the floating point values to fixed point values.

The processor 804 may fetch, decode, and execute the instructions 812 to perform, based on the conversion and selected ones of the plurality of memristive dot product circuits 112, a dot product operation with respect to a sub-matrix and a sub-vector.

What has been described and illustrated herein is an example along with some of its variations. The terms, descriptions and figures used herein are set forth by way of illustration and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. An apparatus comprising:
a processor; and
a non-transitory computer readable medium storing machine readable instructions that when executed by the processor cause the processor to:
ascertain a matrix and a vector including floating point values;
partition the matrix into a plurality of sub-matrices according to a size of a plurality of memristive dot product circuits;
for each sub-matrix of the plurality of sub-matrices, convert the floating point values to fixed point values, wherein to convert the floating point values to fixed point values further causes the processor to:
for each sub-matrix of the plurality of sub-matrices, align mantissas of the fixed point values of a corresponding sub-matrix by independently aligning, for each row of the corresponding sub-matrix, a lowest element within the row of the corresponding sub-matrix with and a highest element within the same row of the corresponding sub-matrix; and
modify the fixed point values of the corresponding sub-matrix with the aligned mantissas to include an equal length for each row of the corresponding sub-matrix; and
perform, based on the conversion and selected ones of the plurality of memristive dot product circuits, a dot product operation with respect to a sub-matrix and the vector, wherein
each ones of the plurality of memristive dot product circuits includes rows including word line voltages corresponding to the floating point values of the vector, conductances corresponding to the floating point values of the corresponding sub-matrix, and columns that include bitline currents corresponding to dot products of the voltages and conductances.

2. The apparatus according to claim 1, wherein the plurality of memristive dot product circuits are disposed in a plurality of clusters, and wherein the instructions are further to cause the processor to:
perform, using memristive dot product circuits of a cluster of the plurality of clusters, the dot product operation on the corresponding sub-matrix of the plurality of sub-matrices.

3. The apparatus according to claim 1, wherein the instructions to modify the fixed point values of the corresponding sub-matrix with the aligned mantissas to include an equal length for each row of the corresponding sub-matrix further cause the processor to:
pad bits representing the mantissas with additional bits such that the fixed point values include an equal length, wherein a padding overhead for each row of the corresponding sub-matrix is limited to the difference between a minimum exponent associated with the lowest element within the row of the corresponding sub-matrix and a maximum exponent associated with the highest element within the same row of the corresponding sub-matrix.

4. The apparatus according to claim 3, wherein the instructions to perform, based on the conversion and selected ones of the plurality of memristive dot product circuits, the dot product operation with respect to the sub-matrix and the vector are further to cause the processor to:
for each sub-matrix of the plurality of sub-matrices, determine a number of bit cells supported by the selected ones of the plurality of memristive dot product circuits; and
map, based on the determined number of bit cells, each element of the corresponding sub-matrix to a corresponding memristive dot product circuit.

5. The apparatus according to claim 4, wherein the instructions to perform, based on the conversion and selected ones of the plurality of memristive dot product circuits, the dot product operation with respect to the sub-matrix and the vector are further to cause the processor to:
perform, based on the mapping of each element of the corresponding sub-matrix to the memristive dot product circuit, a plurality of multiplication operations; and
for each multiplication operation of the plurality of multiplication operations, perform a shift and add operation to generate results of the plurality of multiplication operations.

6. The apparatus according to claim 5, wherein the instructions to perform, based on the conversion and selected ones of the plurality of memristive dot product circuits, the dot product operation with respect to the sub-matrix and the vector are further to cause the processor to:

combine the results of the plurality of multiplication operations to generate a combined result; and adjust, based on a bitslice position, a position of a significant bit of the combined result.

7. The apparatus according to claim 6, wherein the instructions to perform, based on the conversion and selected ones of the plurality of memristive dot product circuits, the dot product operation with respect to the sub-matrix and the vector are further to cause the processor to:

adjust the combined result based on a scale associated with the corresponding sub-matrix.

8. The apparatus according to claim 4, wherein the instructions to perform, based on the conversion and selected ones of the plurality of memristive dot product circuits, the dot product operation with respect to the sub-matrix and the vector are further to cause the processor to:

perform, based on the mapping of each element of the corresponding sub-matrix to the corresponding memristive dot product circuit, a plurality of multiplication operations; and for each multiplication operation of the plurality of multiplication operations and for a negative floating point value of the floating point values, perform a shift and subtract operation to generate results of the plurality of multiplication operations.

9. The apparatus according to claim 1, wherein the instructions are further to cause the processor to:

partition the vector into a plurality of sub-vectors according to the size of the plurality of memristive dot product circuits; and for each sub-vector of the plurality of sub-vectors, convert the floating point values to fixed point values.

10. A computer implemented method comprising:

ascertaining a matrix and a vector including floating point values;

partitioning the matrix into a plurality of sub-matrices according to a size of a plurality of memristive dot product circuits that are disposed in a plurality of clusters;

for each sub-matrix of the plurality of sub-matrices, converting the floating point values to fixed point values wherein converting the floating point values to fixed point values comprises:

for each sub-matrix of the plurality of sub-matrices, aligning mantissas of the fixed point values of a corresponding sub-matrix by independently aligning, for each row of the corresponding sub-matrix, a lowest element within the row of the corresponding sub-matrix with and a highest element within the same row of the corresponding sub-matrix; and modifying the fixed point values of the corresponding sub-matrix with the aligned mantissas to include an equal length for each row of the corresponding sub-matrix; and performing, based on the conversion and selected ones of the plurality of memristive dot product circuits of a cluster of the plurality of clusters, a dot product operation with respect to a sub-matrix and the vector, each ones of the plurality of memristive dot product circuits includes rows including word line voltages corresponding to the floating point values of the vector, conductances corresponding to the floating point values of the corresponding sub-matrix, and columns that include bitline currents corresponding to dot products of the voltages and conductances.

11. The method according to claim 10, wherein modifying the fixed point values of the corresponding sub-matrix with the aligned mantissas to include an equal length for each row of the corresponding sub-matrix comprises:

padding bits representing the mantissas with additional bits such that the fixed point values include an equal length, wherein a padding overhead for each row of the corresponding sub-matrix is limited to the difference between a minimum exponent associated with the lowest element within the row of the corresponding sub-matrix and a maximum exponent associated with the highest element within the same row of the corresponding sub-matrix.

12. The method according to claim 11, wherein performing, based on the conversion and selected ones of the plurality of memristive dot product circuits of the cluster of the plurality of clusters, the dot product operation with respect to the sub-matrix and the vector further comprises:

for each sub-matrix of the plurality of sub-matrices, determining a number of bit cells supported by the selected ones of the plurality of memristive dot product circuits; and mapping, based on the determined number of bit cells, each element of the corresponding sub-matrix to a corresponding memristive dot product circuit.

13. The method according to claim 12, wherein performing, based on the conversion and selected ones of the plurality of memristive dot product circuits of the cluster of the plurality of clusters, the dot product operation with respect to the sub-matrix and the vector further comprises:

performing, based on the mapping of each element of the corresponding sub-matrix to the corresponding memristive dot product circuit, a plurality of multiplication operations; and for each multiplication operation of the plurality of multiplication operations, performing a shift and add operation to generate results of the plurality of multiplication operations.

14. The method according to claim 13, wherein performing, based on the conversion and selected ones of the plurality of memristive dot product circuits of the cluster of the plurality of clusters, the dot product operation with respect to the sub-matrix and the vector further comprises:

combining the results of the plurality of multiplication operations to generate a combined result; and adjusting, based on a bitslice position, a position of a significant bit of the combined result.

15. The method according to claim 14, wherein performing, based on the conversion and selected ones of the plurality of memristive dot product circuits of the cluster of the plurality of clusters, the dot product operation with respect to the sub-matrix and the vector further comprises:

adjusting the combined result based on a scale associated with the corresponding sub-matrix.

16. The method according to claim 12, wherein performing, based on the conversion and selected ones of the plurality of memristive dot product circuits of the cluster of the plurality of clusters, the dot product operation with respect to the sub-matrix and the vector further comprises:

performing, based on the mapping of each element of the corresponding sub-matrix to the corresponding memristive dot product circuit, a plurality of multiplication operations; and for each multiplication operation of the plurality of multiplication operations and for a negative floating point value of the floating point values, performing a shift and subtract operation to generate results of the plurality of multiplication operations.

17. A non-transitory computer readable medium having stored thereon machine readable instructions, the machine readable instructions, when executed, cause a processor to:
ascertain a matrix and a vector including floating point values;
partition the matrix into a plurality of sub-matrices, and the vector into a plurality of sub-vectors according to a size of a plurality of memristive dot product circuits;
for each sub-matrix of the plurality of sub-matrices and for each sub-vector of the plurality of sub-vectors, convert the floating point values to fixed point values, wherein converting the floating point values to fixed point value further causes the processor to:
for each sub-matrix of the plurality of sub-matrices,
align mantissas of the fixed point values of a corresponding sub-matrix by independently aligning, for each row of the corresponding sub-matrix, a lowest element within the row of the corresponding sub-matrix with and a highest element within the same row of the corresponding sub-matrix and
modify the fixed point values of the corresponding sub-matrix with the aligned mantissas to include an equal length for each row of the corresponding sub-matrix; and
perform, based on the conversion and selected ones of the plurality of memristive dot product circuits, a dot product operation with respect to a sub-matrix and a sub-vector.

18. The non-transitory computer readable medium according to claim 17, wherein each ones of the plurality of memristive dot product circuits includes rows including word line voltages corresponding to the floating point values of an associated sub-vector, conductances corresponding to the floating point values of the corresponding sub-matrix, and columns that include bitline currents corresponding to dot products of the voltages and conductances.

19. The non-transitory computer readable medium according to claim 17, wherein the plurality of memristive dot product circuits are disposed in a plurality of clusters, and wherein the machine readable instructions, when executed, further cause the processor to:
perform, using memristive dot product circuits of a cluster of the plurality of clusters, the dot product operation on the corresponding sub-matrix of the plurality of sub-matrices.

20. The non-transitory computer readable medium according to claim 17, wherein the machine readable instructions to modify the fixed point values of the associated sub-matrix with the aligned mantissas to include an equal length for each row of the corresponding sub-matrix further cause the processor to:
pad bits representing the mantissas with additional bits such that the fixed point values include an equal length, wherein a padding overhead for each row of the corresponding sub-matrix is limited to the difference between a minimum exponent associated with the lowest element within the row of the corresponding sub-matrix and a maximum exponent associated with the highest element within the same row of the corresponding sub-matrix.

* * * * *